(12) United States Patent
Takami et al.

(10) Patent No.: US 7,642,482 B2
(45) Date of Patent: Jan. 5, 2010

(54) LASER CRYSTALLIZATION APPARATUS AND CRYSTALLIZATION METHOD

(75) Inventors: Yoshio Takami, Yokohama (JP); Tatsuhiro Taguchi, Kyoto (JP)

(73) Assignees: Advanced LCD Technologies Development Center Co., Ltd., Yokohama-shi (JP); Shimadzu Corporation, Kyoto (JP)

( * ) Notice: Subject to any disclaimer, the term of this patent is extended or adjusted under 35 U.S.C. 154(b) by 94 days.

(21) Appl. No.: 11/608,947

(22) Filed: Dec. 11, 2006

(65) Prior Publication Data

US 2007/0138146 A1 Jun. 21, 2007

(30) Foreign Application Priority Data

Dec. 16, 2005 (JP) ............... 2005-363339

(51) Int. Cl.
*B23K 26/00* (2006.01)
*B23K 26/08* (2006.01)
*H01L 21/268* (2006.01)

(52) U.S. Cl. ............... 219/121.65; 219/121.62; 219/121.81; 438/166; 438/487

(58) Field of Classification Search ............ 219/121.62, 219/121.65, 121.8, 121.81, 121.66; 438/166, 438/487

See application file for complete search history.

(56) References Cited

U.S. PATENT DOCUMENTS

| | | | | |
|---|---|---|---|---|
| 4,952,789 A | * | 8/1990 | Suttie | 219/121.62 |
| 6,281,470 B1 | * | 8/2001 | Adachi | 219/121.62 |
| 6,346,687 B1 | * | 2/2002 | Kinoshita et al. | 219/121.62 |
| 6,451,640 B1 | * | 9/2002 | Ichikawa | 438/199 |
| 2004/0005744 A1 | * | 1/2004 | Taniguchi et al. | 438/166 |
| 2004/0041158 A1 | * | 3/2004 | Hongo et al. | 257/79 |
| 2006/0275673 A1 | * | 12/2006 | Jyumonji | 438/166 |

FOREIGN PATENT DOCUMENTS

DE 4211144 A1 * 10/1993
JP 3-195971 A * 8/1991

(Continued)

OTHER PUBLICATIONS

Kohki Inoue, et al., "Amplitude and Phase Modulated Excimer-Laser Melt-Regrowth Method of Silicon Thin Films—A New Growth Method of 2-D Position-Controlled Large Grains-," Thesis journal of Institute of Electronics, Information and Communication Engineers, vol. J85-C, No. 8, pp. 624-629, Aug. 2002.

*Primary Examiner*—Geoffrey S Evans
(74) *Attorney, Agent, or Firm*—Oblon, Spivak, McClelland, Maier & Neustadt, L.L.P.

(57) ABSTRACT

A laser crystallization apparatus and a crystallization method with a high throughput are provided. Laser light having a predetermined light intensity distribution is irradiated to a semiconductor film to melt and crystallize, wherein a irradiation position is positioned very quickly and with a high positional accuracy, thereby forming the semiconductor film having a large crystal grain size. A laser crystallization apparatus according to one aspect of the present invention comprises a laser light source, a phase shifter modulating laser light to give a predetermined light intensity distribution, marks provided on the substrate, a substrate holding stage moving in a predetermined direction, mark measuring means measuring a time at which the mark passes a predetermined position, and signal generating means generating a trigger signal indicating the irradiation of the laser light based on the measured time.

23 Claims, 10 Drawing Sheets

FOREIGN PATENT DOCUMENTS

| | | | |
|---|---|---|---|
| JP | 9-7968 | | 1/1997 |
| JP | 09-171971 A | * | 6/1997 |
| JP | 11-309593 | | 11/1999 |
| JP | 2000-36698 A | * | 2/2000 |
| JP | 2000-298004 A | * | 10/2000 |
| JP | 2003-100653 A | * | 4/2003 |
| JP | 2003-197521 | | 7/2003 |
| JP | 2004-330221 A | * | 11/2004 |

* cited by examiner

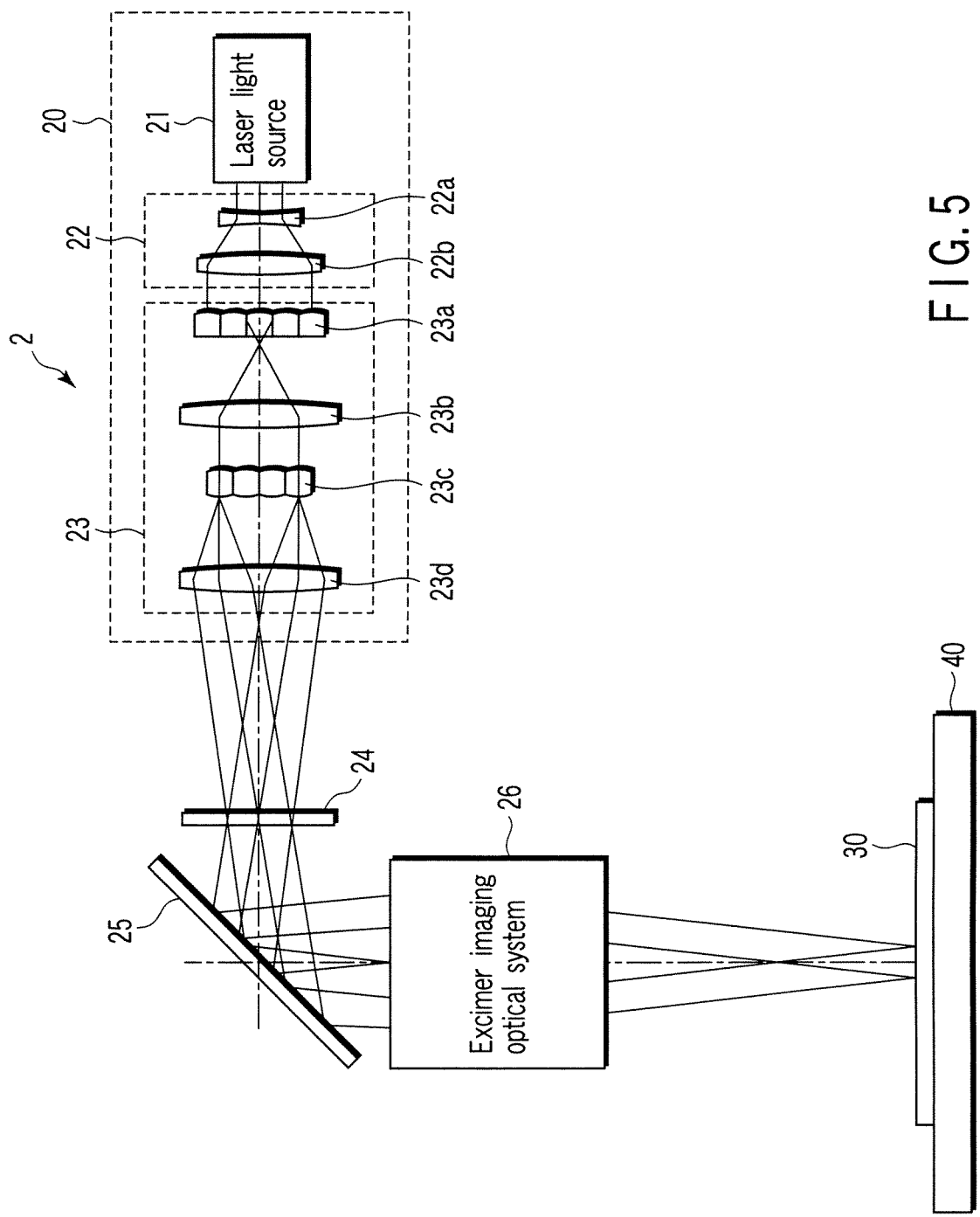
F I G. 5

LASER CRYSTALLIZATION APPARATUS AND CRYSTALLIZATION METHOD

CROSS-REFERENCE TO RELATED APPLICATIONS

This application is based upon and claims the benefit of priority from prior Japanese Patent Application No. 2005-363339, filed Dec. 16, 2005, the entire contents of which are incorporated herein by reference.

BACKGROUND OF THE INVENTION

1. Field of the Invention

The present invention relates to a laser crystallization apparatus and a crystallization method, and more specifically, to a laser crystallization apparatus and a crystallization method in which positioning is performed very quickly and with a high positional accuracy to irradiate laser light for crystallization.

2. Description of the Related Art

A thin film transistor (TFT) formed on a semiconductor film, for example, a silicon film, provided on a large-area substrate, for example, a glass substrate, is used as, for example, a switching device for switched display in an active matrix type liquid crystal display device.

For the crystallization of a non-single crystal semiconductor thin film such as an amorphous or polycrystal semiconductor thin film used to form the thin film transistor, for example, a laser crystallization technique is used, wherein a short-pulse laser light with high energy is used to melt and crystallize an irradiated area of the non-single crystal semiconductor thin film.

Laser crystallization apparatuses presently serving in production employ a method in which crystallizing laser light with a uniform intensity distribution is irradiated to an amorphous silicon film. However, according to the method, the crystal grain size in a crystallized semiconductor film is as small as 0.5 μm or less, and position of the crystallized grains cannot be controlled. Therefore, a crystal grain boundary is present in a channel region of the TFT, so that there is a limitation in performance of the TFT, for example, uneven characteristics.

There has been a demand for a technique to manufacture a high-quality semiconductor film having large crystal grains, in order to improve the performance of the TFT. As a crystallization method satisfying this demand, among various laser crystallization techniques, an attention is particularly focused on phase modulated excimer laser annealing (PMELA) in which excimer laser light having a light intensity distribution in an inverse peak pattern shape generated by phase modulation is irradiated to the non-single crystal semiconductor thin film, thereby crystallizing the same. The PMELA technique is a method in which excimer laser light having a predetermined light intensity distribution is irradiated to the non-single crystal semiconductor thin film so that an irradiated portion of the semiconductor film is melted and crystallized. The excimer laser light having the predetermined light intensity distribution can be obtained by the phase modulation of incident laser light using a phase modulating element, for example, a phase shifter. The non-single crystal semiconductor thin film is, for example, a thin film of amorphous silicon or polycrystal silicon formed on a glass substrate. In the currently developed PMELA technique, an area sized at about several millimeters square is melted and crystallized by one laser irradiation. Owing to the crystallization of the non-single crystal semiconductor thin film, a crystallized silicon thin film with good quality is formed in which crystal grains are sized at several μm to about 10 μm and relatively uniform in size (e.g., refer to "Amplitude and Phase Modulated Excimer-Laser Melt-Regrowth Method of Silicon Thin-Film—A New Growth Method of 2-D Position Controlled Large-Grains—", published by Kohki Inoue, Mitsuru Nakata and Masakiyo Matsumura in a thesis journal of Institute of Electronics, Information and Communication Engineers, Vol. J85-C, No. 8, pp. 624-629, 2002). It has been proved that the TFT manufactured in the crystallized silicon thin film formed by this technique has stable electric properties.

In crystallization apparatuses of a conventional method, crystallizing laser light irradiates the semiconductor film in a shape of a long rectangle beam (e.g., 500 μm×300 mm) and with a uniform light intensity distribution. Thus, it is technically impossible to position a place where crystal grains are to be formed, and the crystal grain size in the crystallized semiconductor film is as small as 0.5 μm or less. Therefore, it is not required to absolutely positioning the irradiation position of the crystallizing laser light.

Means for irradiating laser light for crystallization based on an alignment marker provided in a semiconductor layer has been described in Jpn. Pat. Appln. KOKAI Publication No. 2003-197521. However, the laser irradiation means is a laser irradiation method for forming a polycrystalline area but not for forming large-diameter crystallized grains in a predetermined position.

On the other hand, the PMELA crystallization technique is presently under development, wherein crystallizing laser light having an inverse-peak-shaped beam profile is generated by using the phase shifter or a diffracting optical element, and irradiated to the non-single crystal semiconductor film. The PMELA crystallization technique has good characteristics such that efficiency of crystallizing laser light used is high, crystals with large grain sizes can be obtained and the positioning of crystal grains is possible. However, a so-called step-and-repeat irradiation method is employed to crystallize a semiconductor film with a large area. That is, the following is repeated: after one irradiation of the laser light to the non-single crystal semiconductor film, the glass substrate is moved to and stopped at the next irradiation position, and then the laser light is irradiated again. Thus, there is a challenge to further improve throughput so that the PMELA crystallization technique becomes a mass-production technique. The present applicant has been developing a technique to industrialize the PMELA crystallization technique, and is developing a crystallization method with a higher throughput.

There are the following requirements to put the PMELA technique having the excellent characteristics as described above into practical use as an apparatus for producing, e.g., liquid crystal panels: positioning and forming crystal grains with an absolute positional accuracy on a micrometer order to form the main part of the TFT; and irradiating the crystallizing laser light so that the positioning and formation of the crystal grains can be repeatedly reproduced very quickly.

It is one of the object of the present invention to provide a laser crystallization apparatus and a crystallization method with a high throughput capable of forming a semiconductor film having a crystallized area with a large crystal grain size at a predetermined position on a processing substrate, i.e., a substrate to be processed, by irradiating pulse laser light having a predetermined light intensity distribution to the processing substrate to melt and crystallize the semiconductor film.

BRIEF SUMMARY OF THE INVENTION

The above-mentioned problems are solved by a laser crystallization apparatus and a crystallization method according to the present invention below.

According to one aspect of the present invention, it is provided a laser crystallization apparatus comprising: a laser light source which generates laser light; and a phase shifter which modulates the laser light to give a predetermined light intensity distribution thereto, wherein the laser light modulated by the phase shifter is irradiated to a thin film provided on a substrate to melt and crystallize the thin film, the laser crystallization apparatus comprising: marks provided on the substrate; a substrate holding stage which mounts the substrate and which moves in a predetermined direction; mark measuring means measuring a time at which the mark passes a predetermined position during the movement of the substrate holding stage; and signal generating means generating a trigger signal which indicates the irradiation of the laser light on the basis of the time measured by the mark measuring means.

According to another aspect of the present invention, it is provided a laser crystallization apparatus comprising: a laser light source which generates laser light; and a phase shifter which modulates the laser light to give a predetermined light intensity distribution thereto, wherein the laser light modulated by the phase shifter being irradiated to a thin film provided on a substrate to melt and crystallize the thin film, the laser crystallization apparatus comprising: a substrate holding stage which mounts the substrate and which continuously moves in a predetermined first direction; first marks which are provided on the substrate and which indicate positions in the first direction; second marks which indicate positions in a second direction perpendicular to the first direction on the substrate, first mark measuring means measuring a time at which the first mark passes a predetermined position in the first direction during the continuous movement; second mark measuring means measuring the second mark and indicating a correction of the position of the substrate in the second direction; and signal generating means generating a trigger signal which indicates the irradiation of the laser light on the basis of the time measured by the first mark measuring means.

According to another aspect of the present invention, it is provided a laser crystallization method comprising: forming marks on a substrate; generating laser light; modulating the laser light; continuously moving a substrate holding stage mounting the substrate in a predetermined direction; measuring a time at which the mark provided on the moving substrate passes a predetermined position; generating a trigger signal which indicates the irradiation of the modulated laser light on the basis of the measured time; and irradiating the modulated laser light to a thin film disposed on the substrate in response to the trigger signal to melt and crystallize an irradiated area.

According to another aspect of the present invention, it is provided a laser crystallization method comprising: forming, on a substrate, first marks indicating positions of the substrate in a predetermined first direction and second marks indicating positions of the substrate in a second direction perpendicular to the first direction; generating laser light; modulating the laser light; mounting the substrate on a substrate holding stage; measuring the second mark to adjust the position of the substrate in the second direction; continuously moving the substrate holding stage mounting the substrate in the first direction; measuring a time at which the first mark provided on the moving substrate passes a predetermined position; generating a trigger signal which indicates the irradiation of the modulated laser light on the basis of the time measured by the first mark measurement; and irradiating the modulated laser light to the substrate in response to the trigger signal to melt and crystallize a thin film disposed on the substrate.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIGS. 3A and 3B are diagrams showing one example of marks formed on the processing substrate shown in FIG. 2, wherein FIG. 3A is a plan view for explaining entire mark arrangement on the processing substrate, and FIG. 3B is an enlarged view for explaining the relation between one mark and a crystallizing laser light irradiation area;

FIG. 5 is a diagram showing one example of the main parts of a crystallization optical system using a phase shifter and used in the laser crystallization apparatus shown in FIG. 1;

DETAILED DESCRIPTION OF THE INVENTION

Figure 1:
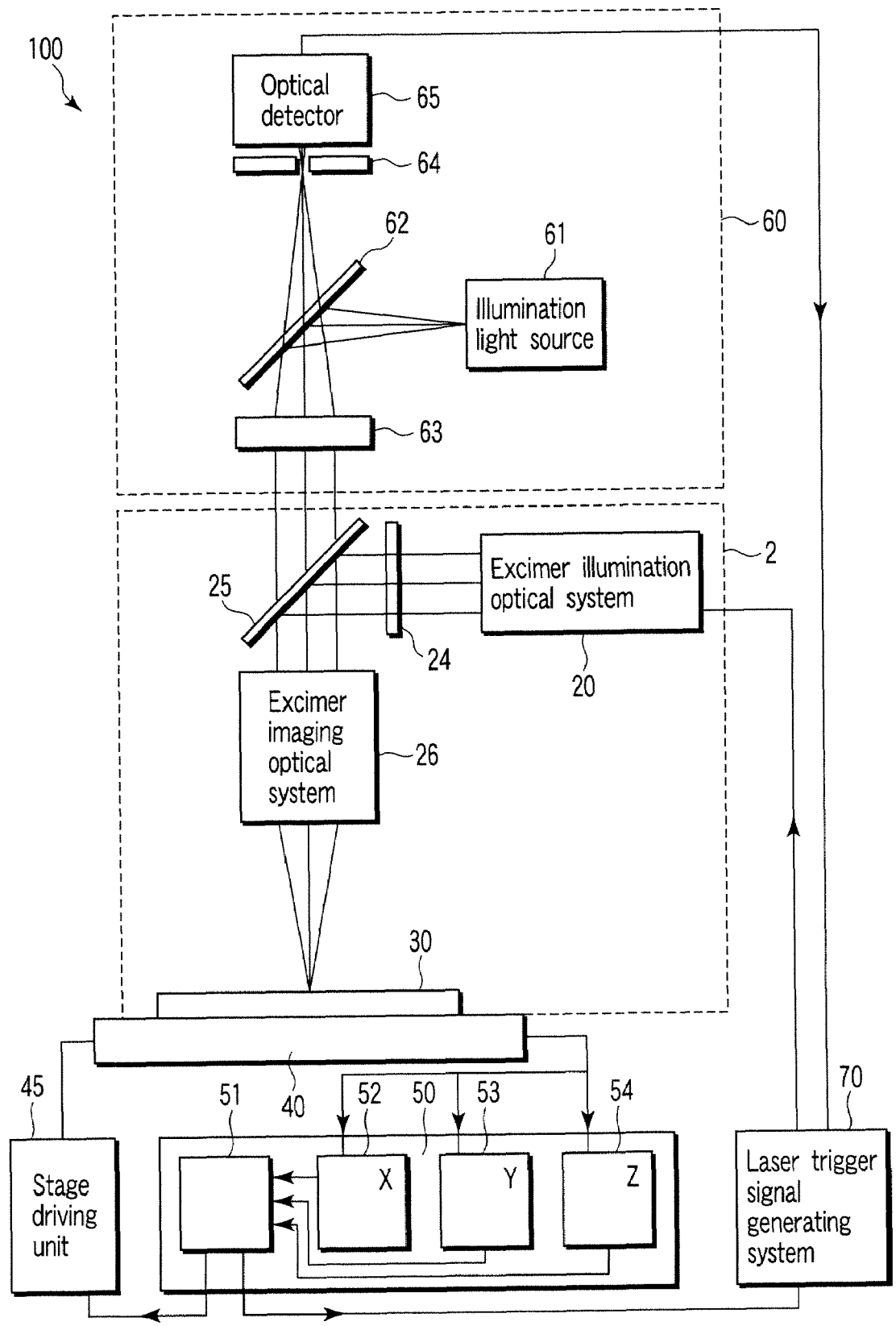
FIG. 1 is a system configuration diagram showing one example of a laser crystallization apparatus to explain a first embodiment of the present invention.

The present invention provides a laser crystallization apparatus and a crystallization method for crystallizing a non-single crystal semiconductor film which achieve high positioning accuracy of a crystallizing laser light irradiation position and a high throughput. In the laser crystallization apparatus and the crystallization method of the present embodiments, a phase modulation element (hereinafter referred to as a phase shifter) is used to give a desired light intensity distribution to crystallizing laser light, and then the crystallizing laser light is irradiated to the non-single crystal semiconductor film to form a crystallized semiconductor film.

In this specification, the high throughput means that a crystallization area is formed at a predetermined position on a processing substrate while a substrate holding stage is continuously moving in one direction, for example, in X direction without stopping. The continuous movement means moving in one direction without changing a moving velocity. A crystallizing laser light irradiation position in a predetermined direction of the substrate holding stage or the processing substrate means a predetermined crystallization area or a crystallizing laser light irradiation position for crystallization. Deciding the crystallizing laser light irradiation position means deciding or correcting the timing for irradiation of the crystallizing laser light on the basis of a measured value (signal) by measuring a time at which the mark provided on the processing substrate passes a predetermined position during the continuous movement of the substrate holding stage. A large crystallization area means an area of a crystallized semiconductor film having an area equal to or larger than at least a channel area of the TFT.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit of the invention.

First Embodiment

A first embodiment of the present invention provides a laser crystallization apparatus and a crystallization method wherein a time at which a mark formed on a processing substrate passes a predetermined position is measured while a substrate holding stage is being continuously moved in a predetermined direction, and a timing for irradiating crystallizing laser light to the processing substrate is decided on the basis of a measured value.

One example of a laser crystallization apparatus 100 used in the present embodiment is shown in FIG. 1. The laser crystallization apparatus 100 comprises a crystallization optical system 2, a substrate holding stage 40, a stage position measuring system 50, a mark measuring system 60, and a laser trigger signal generating system 70. In an optical system of the laser crystallization apparatus 100, an optical path of the mark measuring system 60 is formed coaxially with the path of crystallizing laser light in the crystallization optical system 2. In the optical system of the laser crystallization apparatus 100, crystallizing laser light from an excimer illumination optical system 20 and illumination light from a mark measuring illumination system 61 are configured to be guided to the above-mentioned optical path via mirrors 25 and 62, respectively.

A processing substrate 30 in which marks 35 are formed is mounted at a predetermined position on the substrate holding stage 40. The substrate holding stage 40 is continuously moved in one predetermined direction, for example, a longitudinal direction (e.g., X direction) of the processing substrate 30, by a stage driving unit 45.

In the mark measuring system 60, an optical detector 65 optically measures the mark 35 (see FIGS. 3A and 3B) provided on the moving processing substrate 30 in advance, and outputs a measured result to the laser trigger signal generating system 70. The laser trigger signal generating system 70 decides timing for irradiating crystallizing laser light to a predetermined position on the processing substrate 30 on the basis of the measured value by the optical detector 65 and positional information of the stage from the stage position measuring system 50. After deciding the timing, the laser trigger signal generating system 70 outputs a laser trigger signal to an excimer laser light source of an excimer illumination optical system 20 immediately after the detection of the mark 35. The excimer illumination optical system 20 emits the crystallizing laser light and irradiates it on the processing substrate 30 via a phase shifter 24, immediately or after a predetermined delay time.

Figure 2:
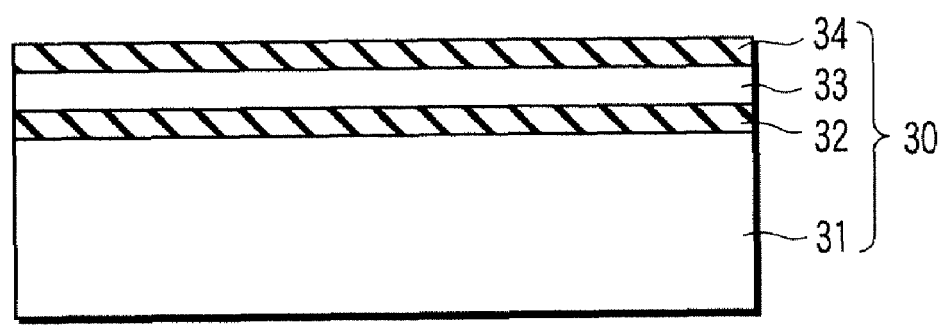
FIG. 2 is a sectional view shown to explain one example of the structure of a processing substrate to be crystallized by the laser crystallization apparatus.

The processing substrate 30 is detachably mounted to a predetermined position on the substrate holding stage 40 by, for example, vacuum suction. The processing substrate 30 is, for example, a large-area substrate of 550 mm×650 mm. A structure of the processing substrate 30 to be subjected to the crystallization is generally as shown in FIG. 2, wherein the non-single crystal semiconductor film 33 on an insulating film 32 is formed on a support substrate 31, and an insulating film 34 is provided as a cap film on the semiconductor film 33. The non-single crystal semiconductor film 33 is, for example, an amorphous silicon film, a polycrystal silicon film, a sputtered silicon film, a silicon germanium film or a dehydrogenated amorphous silicon film. The support substrate 31 is, for example, a glass substrate, an insulating substrate such as a plastic substrate, a semiconductor substrate such as a silicon wafer.

The thickness of the non-single crystal semiconductor film 33, for example, the dehydrogenated amorphous silicon film, ranges 30 nm to 300 nm, and is, for example, 50 nm. The insulating film 32 is a film provided to prevent undesirable impurities from diffusing from the support substrate 31 to the non-single crystal semiconductor film 33 during its crystallization process.

The cap insulating film 34 has a function of storing heat generated when the non-single crystal semiconductor film 33 is irradiated with the laser light for the crystallization by using reflecting properties and endothermal properties of the cap insulating film 34 to the crystallizing laser light. The heat storing effect of the cap insulating film 34 enables the formation of crystal grains large in size (5 µm or more) in the molten area of the non-single crystal semiconductor film 33. The cap insulating film 34 enhances the efficiency of the crystallization, but it can be omitted.

Figure 3A:
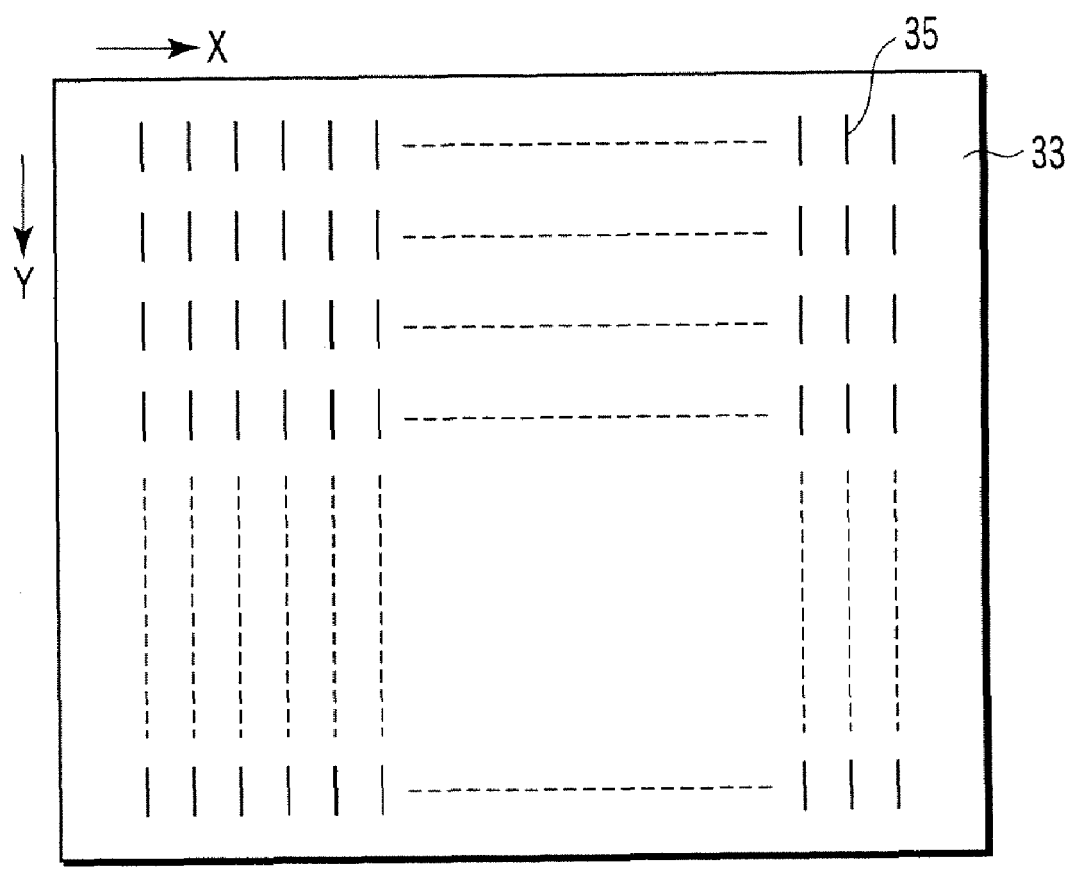

Before a crystallization process for forming the grain size larger, the marks 35 are formed in the non-single crystal semiconductor film 33 provided in the processing substrate 30 using, for example, a crystallization technique, a lithography technique and an etching technique, as shown by way of example in FIG. 3A. The marks 35 are patterns, which are optically detectable by the mark measuring system 60, and are required to have no adverse effect on the crystallization.

As long as this requirement is satisfied, the marks 35 are not limited to be formed in the non-single crystal semiconductor film 33, and can be formed in the cap insulating film 34, for example, a silicon oxide film or a silicon nitride film, formed on the non-single crystal semiconductor film 33.

The marks 35 are provided to highly accurately decide or correct the crystallizing laser light irradiation position at least in one direction (e.g., X direction) in which the processing substrate 30 is continuously moving. The marks 35 are, for example, periodic patterns formed linearly arranged in the direction of the continuous movement, and are formed at positions having a specific relation with the irradiation positions of the crystallizing laser light. Although the marks 35 can be formed in the vicinity of the irradiation positions of the crystallizing laser light, it may also be formed at positions apart from the irradiation positions with a specific relation between the marks 35 and the irradiation positions. Moreover, the marks 35 can be formed at positions corresponding to the respective crystallizing laser light irradiation positions, or can be formed, for example, every other crystallizing laser light irradiation position or every few crystallizing laser light irradiation positions, or only about a few marks 35 can be formed in the direction of the continuous movement of the substrate. Alternatively, the marks 35 can be formed more numbers than the number of the crystallizing laser light irradiation positions, and an amount of the movement of the processing substrate 30 can be directly measured more precisely.

Figure 3B:
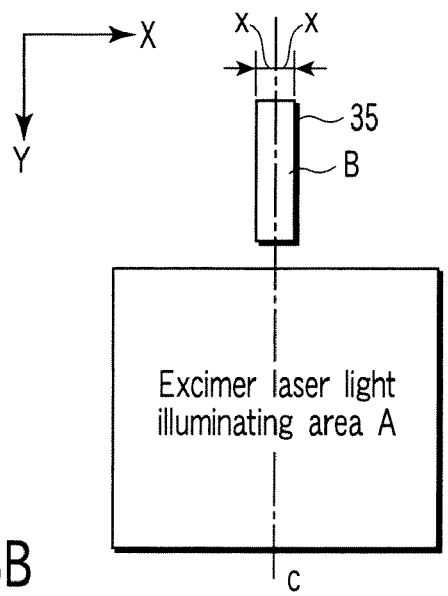

One example of a pattern of the mark 35 is shown in FIG. 3B. This pattern is a line having a width of several µm to several ten µm which is long in a Y direction perpendicular to the direction of the continuous movement (X direction), and is provided adjacently to the Y direction of a crystallizing laser light irradiation area. For example, if a line pattern having a width of 2 µm can be optically read with a moving velocity of 500 mm/sec of the substrate holding stage 40, then it can be obtained a signal having a pulse width of $2\times10^{-6}$ (m)/0.5 (m/sec)=4 µsec. In the example shown, the marks 35 having a width of 2 µm and a length of 100 µm are formed at intervals of 5 mm in the non-single crystal semiconductor film 33 so that the number of marks corresponds to the number of the crystallizing laser light irradiation positions.

If a centerline of an area B of the mark 35 is being disposed to coincide with a centerline C of an excimer laser light irradiation area A of, for example, 5 mm×10 mm, a width 2× of the mark 35 is decided as follows. Assume that a delay time from the detection of a leading edge of the mark 35 to the irradiation of the excimer laser light is 2 µsec, and that the moving velocity of the substrate holding stage 40 is 500 mm/sec. The substrate holding stage 40 moves during the above-mentioned delay time by 500 (mm/sec)×$2\times10^{-6}$ (sec)= $1\times10^{-3}$ (mm)=1 (µm). In other words, if the leading edge of the mark 35 is displaced by 1 µm from the centerline C of the predetermined excimer laser light irradiation area A, a centerline of an actual crystallizing laser light irradiation area coincides with the centerline C of the predetermined excimer laser light irradiation area A. Since the movement of the stage in the X direction is reciprocating, it is only necessary to displace the edges of the mark 35 by 1 µm to right and left from the centerline C, that is, set the width of the mark 35 at 2 µm.

The mark measuring system 60, shown in FIG. 1, is a system in which illumination light emitted from an illumination light source 61 for optical measurement of the marks 35 illuminates the mark 35 on the processing substrate 30 via a mirror 62, a visible light correcting lens 63, the mirror 25 and the excimer imaging optical system 26, and the reflected light from the mark 35 transmitted through the mirror 62 is detected by the optical detector 65, for example, an imaging device, through a pin hole 64 provided on the light path.

The mark measuring system 60 comprises at least one set of the illumination light source 61 and the optical detector 65. The illumination light, for example, visible laser light, from the illumination light source 61 illuminates the processing substrate 30, and the reflected light from the marks 35 for positional detection is passed through the pin hole 64 via the visible light correcting lens 63. The marks 35 are periodically arranged along the direction of the continuous movement of the substrate holding stage 40 at positions away from the irradiation position by a specific distance. Thus, the marks 35 are detected by the optical detector 65.

Since the intensity of the light reflected from the marks 35 changes at the edges of the marks 35, the positions of the marks 35 can be accurately measured from the edges of detected signals. While the optical detector 65 has been described in the embodiment employing an imaging device, the optical detector 65 may be any sensor as long as it is capable of detecting the edges of the marks 35. The optical detector 65 is required to have a sufficiently fast signal response equal to or less than one microsecond, and it can be used a high-speed two-dimensional detector (e.g., a photodiode array or CMOS sensor), in addition to a photodiode or a photomultiplier tube.

Figure 4:
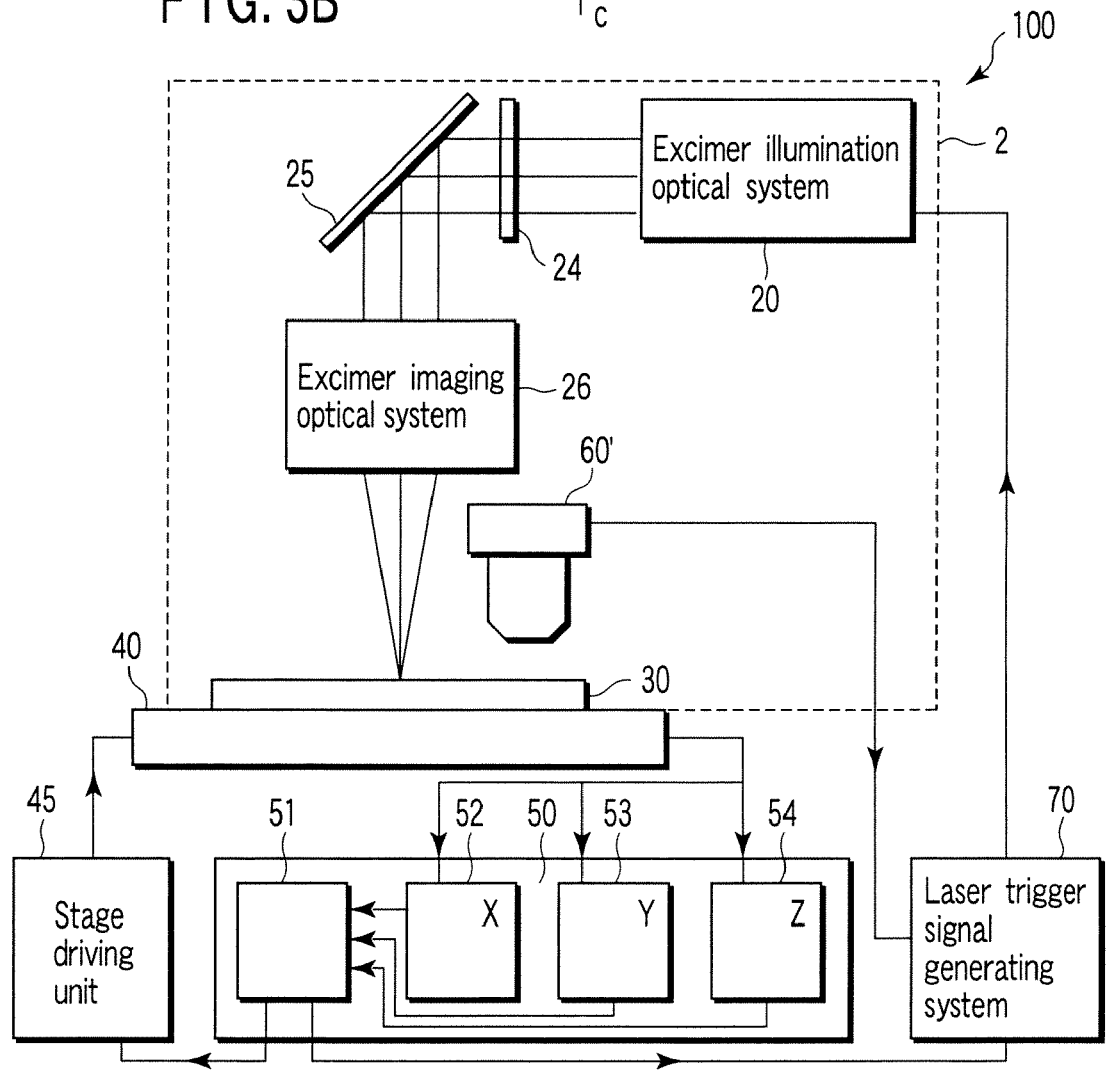
FIG. 4 is a system configuration diagram shown to explain a modification of a mark measuring optical system of the laser crystallization apparatus in the first embodiment.

Although the mark measuring system 60 is an optical system using the excimer imaging optical system 26 in FIG. 1, it can be disposed a simplified mark measuring system 60' on the side of (beside) the excimer imaging optical system 26 as shown in FIG. 4, instead. In this case, the measurement position of the mark measuring system 60' and the irradiation position of the crystallizing laser light need to be in a specific relative relation. Such a positional relation can be, for example, a position B adjacent to the Y direction of the irradiation area of the crystallizing excimer laser light, as shown in FIG. 3B. In FIG. 4, the same numerals are assigned to the same parts as those in FIG. 1 to FIG. 3, and these parts are not described in detail.

Next, parts other than the mark measuring system 60 of the laser crystallization apparatus 100 shown in FIG. 1 will be described.

The crystallization optical system 2 comprises a light source, for example, an excimer illumination optical system 20, and a sequential arrangement of a phase shifter 24, a reflecting mirror 25, and an excimer imaging optical system 26 disposed on an outgoing optical path of the optical system 20. The excimer illumination optical system 20 is an optical system, which emits and adjusts the crystallizing laser light for illuminating the phase shifter 24 as shown in FIG. 3. The excimer illumination optical system 20 comprises an excimer laser light source 21 for generating pulse laser light in response to the input of the laser light generation indicating signal, and a homogenizer 23 for forming the pulse laser light into a light flux having a uniform light intensity distribution.

The phase shifter 24 conditions the crystallizing laser light by phase modulation so that it has a predetermined light intensity distribution. The excimer imaging optical system 26 reduces and irradiates the crystallizing laser light phase-modulated by the phase shifter 24 to the non-single crystal semiconductor film 33 to be crystallized. In FIG. 1, the crystallization optical system 2 is shown in a projection type in which the phase shifter 24 is disposed between the excimer illumination optical system 20 and the excimer imaging optical system 26. Another crystallization optical system 2 that can be employed is a proximity type in which the phase shifter 24 is disposed in proximity to the processing substrate 30.

The substrate holding stage 40 is a stage which detachably mounts the processing substrate 30 and which has a mechanism movable in X, Y and Z directions owing to a stage driving unit 45. The substrate holding stage 40 can comprise, as necessary, an α or β adjusting function for angle adjustment which rotates on an X axis or Y axis, and γ adjusting function which rotates on a Z axis. A high positional accuracy and good reproducibility are required for the movement of the substrate holding stage 40, and the substrate holding stage 40 is moved by, for example, a combination of an air bearing and a linear motor driving mechanism. A moving velocity in the X direction is, for example, 500 mm/sec.

The stage position measuring system 50 highly accurately measures the position of the moving substrate holding stage 40. The stage position measuring system 50 comprises a stage position control unit 51, an X-direction position measuring unit 52, a Y-direction position measuring unit 53 and a Z-direction position measuring unit 54. The output of the stage position measuring system 50 is sent to the stage driving unit 45. Further, the output of the stage position measuring system 50 is also supplied to the laser trigger signal generating system 70 as necessary.

The X-direction position measuring unit 52 and the Y-direction position measuring unit 53 can measure the position of the substrate holding stage 40 very quickly and with a high positional accuracy on the order of several ten nm. For example, the X-direction and Y-direction position measuring units 52 and 53 count pulse signals corresponding to the moving distance of the substrate holding stage 40 in the X direction and Y direction, respectively, by using laser interferometers or linear scales.

The Z-direction position measuring unit 54 measures the height of the processing substrate 30, and can be used, for example, the above-mentioned linear scale. However, although not shown in the drawings, there are variations in the thickness of the glass substrate by about several 10 μm, the use of a sample surface position measuring system is more effective which measures the actual height of the surface of the processing substrate 30 using, for example, surface reflection of a laser light. Regarding the position for measuring the height of the surface on the processing substrate 30, it can be measured a height of the surface at the next irradiated position on the processing substrate 30 in advance to control the Z axis position, other than a above mentioned the height of the surface of the current crystallizing laser light irradiation position.

The laser trigger signal generating system 70 generates a trigger signal for the crystallizing laser light in advance in anticipation of a delay time until the irradiation of the crystallizing laser light, thus the crystallizing laser light can be irradiated on a desired time after the substrate holding stage 40 moves to the predetermined position where the crystallizing laser light is to be irradiated. In order to decide the time for the crystallizing laser light irradiation, either method may be employed: directly deciding based on readings of the marks 35 on the processing substrate 30 by the mark measuring system 60; or correcting a stage position signal from the stage position measuring system 50 by measuring the mark 35 on the substrate 30. In the latter case, the laser trigger signal generating system 70 compares a pulse count value from measured signals of marks on the processing substrate 30 with an X position pulse signals from the stage position measuring system 50, and performs computation, thereby generating a trigger signal. A delay time from the arrival of the substrate holding stage 40 at a predetermined position to the generation of the trigger signal for the crystallizing laser light by the laser trigger signal generating system 70 is 1 μsec or less. Moreover, the time from the receipt of the trigger signal by the excimer laser light source 21 to the emission of the crystallizing laser light is also 1 μsec or less.

FIG. 5 is a diagram showing one example of the excimer illumination optical system 20 of the crystallization optical system 2 used in the laser crystallization apparatus 100 shown in FIG. 1. The excimer illumination optical system 20 further includes a beam expander 22 and a homogenizer 23 provided on the same optical axis of the laser light source 21.

The laser light from the laser light source 21 is expanded by the beam expander 22 and homogenized in the in-plane intensity by the homogenizer 23, and then the laser light is irradiated to the phase shifter (phase modulating element) 24. The excimer laser light transmitted through the phase shifter 24 is modulated light having a predetermined light intensity distribution, for example, the inverse-peak-pattern light intensity distribution, and its direction is changed toward the processing substrate 30 by the reflecting mirror 25, and then the excimer laser light is irradiated onto the processing substrate 30 via the imaging optical system 26, for example, the excimer imaging optical system.

The laser light source 21 outputs a laser light with energy sufficient to melt the non-single crystal semiconductor film 33, for example, the amorphous or polycrystal semiconductor film provided on the processing substrate 30, for example, outputs light with energy of 1 J/cm$^2$ on the non-single crystal semiconductor film 33. The laser light source 21 is, for example, an excimer laser light source, and outputs pulse laser light having a short pulse, for example, a half-value width of about 25 to 30 nsec. The laser light is preferably, for example, KrF excimer laser light having a wavelength of 248 nm or XeCl excimer laser light having a wavelength of 308 nm. For example, the excimer laser source 21 is a pulse oscillating type and has an oscillation frequency ranging, for example, from 100 Hz to 300 Hz. In the present embodiment, the KrF excimer laser light having an oscillation frequency of 100 Hz and a half-value width of 25 nsec is used. Further, a light energy amount of the KrF excimer laser light irradiated onto the processing substrate 30 is, for example, about 1 J/cm$^2$ which is necessary to melt the non-single crystal silicon film. The laser source 21 emits the pulse laser light.

The beam expander 22 expands incident laser light, and comprises a concave lens 22a for expanding the light and a convex lens 22b for forming parallel light, as shown in FIG. 5.

The homogenizer 23 has a function to define a dimension of the incident laser light in an XY section and to homogenize a light intensity distribution within the defined shape. For example, a plurality of X-direction cylindrical lenses are arranged in the Y direction to form a plurality of light fluxes arranged in the Y direction, and the light fluxes are superposed on each other in the Y direction by an X-direction condenser lens and then redistributed. In the same manner, a plurality of Y-direction cylindrical lenses are arranged in the X direction to form a plurality of light fluxes arranged in the X direction, and the light fluxes are superposed on each other in the X direction by a Y-direction condenser lens and then redistributed. More specifically, as shown in FIG. 5, the homogenizer 23 comprises a first homogenizer including X-direction cylindrical lenses 23a and an X-direction condenser lens 23b, and a second homogenizer including Y-direction cylindrical lenses 23c and a Y-direction condenser lens 23d. The first homogenizer homogenizes the laser light intensity in the Y-axis direction on the phase shifter 24, and the second homogenizer homogenizes the laser light intensity in the X-axis direction on the phase shifter 24. Therefore, the KrF excimer laser light is conditioned by the homogenizer 23 to illumination light having a predetermined angle of spread and a homogenized light intensity in section, and irradiates the phase shifter 24.

The phase shifter 24 is one example of the phase modulating element, and is a quartz glass substrate with steps, for example. The laser light causes diffraction and interference at a boundary of the step to provide a periodic spatial distribution in the laser light intensity, and a phase difference of 180°, for example, is provided between right and left side of the step. The phase shifter 24 with a phase difference of 180° between right and left side of the step phase-modulates the incident light to light having a symmetrical inverse-peak-shaped light intensity distribution. A step (thickness difference) d can be derived from $d=\lambda/2(n-1)$, where $\lambda$ is the wavelength of the laser light and n is the refractive index of a transparent substrate of the phase shifter. From this equation, the phase shifter 24 can be produced by, for example, forming the step d on the quartz glass substrate corresponding to the predetermined phase difference of the light. For example, as the refractive index of the quartz substrate is 1.46, the wavelength of the KrF excimer laser light is 248 nm, thus a step height to provide a phase difference of 180° is 269.6 nm. The step of the quartz glass substrate can be formed by selective etching or a focused ion beam (FIB) processing. The phase shifter 24 has the step formed in such a manner that the incident light is phase-modulated to form the inverse-peak-shaped light intensity distribution, and shifts the phase of the excimer laser light by a half-wave length. As a result, the crystallizing laser light irradiating the semiconductor film 33 has the inverse-peak-pattern light intensity distribution in which a part corresponding to the phase-shifted portion (step) is at the minimum light intensity. According to this method, a predetermined light intensity distribution can be obtained without using a metal pattern, which is used in other methods and to shield the excimer laser light to obtain a predetermined light intensity distribution.

The crystallizing laser light which has been transmitted through the phase shifter 24 is imaged with a predetermined light intensity distribution on the processing substrate 30 disposed in a position conjugate with the phase shifter 24 by the excimer imaging optical system 26 whose aberration is corrected. The excimer imaging optical system 26 comprises a lens group including a plurality of calcium fluoride ($CaF_2$) lenses and/or synthetic quarts lenses, for example. The excimer imaging optical system 26 is a long focal distance lens having performance such as a reduction ratio of 1/5, an N.A. of 0.13, a resolution of 2 µm, a depth of focus of ±10 µm, a working distance ranging from 50 mm to 70 mm.

The excimer imaging optical system 26 arranges the phase shifter 24 and the processing substrate 30 at optically conjugate positions. In other words, the non-single crystal semiconductor film 33 on the processing substrate 30 is disposed in a surface optically conjugate with the phase shifter 24 (an image surface of the excimer imaging optical system 26). The excimer imaging optical system 26 is a telecentric optical system with an aperture stop between lenses.

Using such a crystallization optical system 2, the crystallizing laser light having a desired light intensity distribution can be irradiated to the processing substrate 30.

The crystallization process by the laser crystallization apparatus 100 as shown in FIG. 1 is based on the assumption that the crystallization is carried out so that the oscillation frequency of the crystallizing laser light is fixed and the substrate holding stage 40 is moved at a fixed velocity. The moving velocity of the substrate holding stage 40 is determined in accordance with the oscillation frequency (i.e., laser irradiation time) of the crystallizing laser light source 21 and an area for one crystallizing laser light irradiation.

Conditions of the crystallizing laser light for the crystallization process includes, for example, a crystallization fluence of the crystallizing laser light of 1 J/$cm^2$, an oscillation frequency of the laser light source 21 of 100 Hz, a pulse width of the laser light of, for example, 30 nsec, and an irradiation area of 5 mm×10 mm. If the processing substrate 30 is irradiated without leaving unirradiated space with such conditions, then the substrate holding stage 40 moves 5 mm during an interval (100 Hz) of the irradiation of the laser light. That is, the moving velocity (V) of the substrate holding stage 40 has only to be set at V=5 mm×100 Hz=500 mm/sec. A moving distance corresponding to the pulse width of the crystallizing laser light, for example, 30 nsec is sufficiently small as compared with a moving velocity (V) of the substrate holding stage 40 of 500 mm/sec, since the moving distance is 500 mm/sec×30 nsec=15000×$10^{-9}$ mm=15×$10^{-6}$ mm=15 nm. Accordingly, it can be said that the crystallizing laser light is substantially stationary. Therefore a predetermined irradiation area of the crystallizing laser light can be irradiated with and melted by the crystallizing laser light while the substrate holding stage 40 is moving. In other words, the crystallization process described above enables the crystallization by the pulse laser light while the substrate holding stage 40 is in a continuously moving state. The substrate holding stage 40 continuously moves in a predetermined direction relatively to the position to which the crystallizing laser light is irradiated by the laser light source.

Such a high moving velocity of the substrate holding stage 40 can be achieved by a driving mechanism which is a combination of the air bearing and a linear motor. However, the velocity stability of the air bearing/linear motor driving mechanism is about ±0.1% at most. Therefore, the positional accuracy when the laser oscillation frequency is fixed at 100 Hz and the crystallizing laser light is irradiated while continuously moving the substrate holding stage 40 at a velocity of 500 mm/sec results in (500 mm/sec±0.1%)×(1/100 sec)= 5 mm±0.1%=4995 µm to 5005 µm, which causes an error of the irradiation position of ±5 µm. When the laser oscillation frequency is thus fixed, it is impossible to obtain a required positional accuracy of ±1 µm. That is, the position for forming the crystal grains cannot be brought to a predetermined positional accuracy of 1 µm or less, if the crystallization is carried out so that the oscillation frequency of the crystallizing laser light is fixed and the substrate holding stage 40 is moved at a fixed velocity. Therefore, it is necessary to control and determine the irradiation timing of the crystallizing laser light on the basis of some positional measurement so that the laser light is irradiated to the predetermined irradiation position of the processing substrate 30 or the substrate holding stage 40.

The stage position measuring system 50 measures the position of the stage by an interferometer or a linear scale, and can measure the distance of the movement of the stage with a positional resolution of several 10 nm. A case will be considered in which the crystallizing laser light is irradiated at every 5 mm moving distance on the basis of the stage measurement signal. Here, it is assumed that no expansion of the substrate 30 occurs. If a delay time from the measurement of the 5 mm of moving distance to the irradiation of the crystallizing laser light is 2 µsec, a distance of the movement of the stage during this delay time results in (500 mm/sec±0.1%)×2 µsec=1 µm±0.1%=0.999 µm to 1.001 µm (a positional error of 0.001 µm or less), such that the requirement for the positional accuracy of ±1 µm or less can be sufficiently satisfied.

However, if the thermal expansion of the substrate 30 has occurred, then it is necessary to make a correction to the stage position measurement signal based on the measurement of the marks 35 on the substrate 30. In the example of the laser crystallization apparatus 100 as in the present embodiment, since the non-single crystal semiconductor film 33 is heated to a temperature of 1000° C. or more and thus melted, the thermal expansion of the substrate 30 becomes large, so that it is necessary to make a correction on the basis of the measurement of the marks 35 formed on the substrate 30. For example, when there is a temperature raise of 1° C. in the glass substrate having a length of one side of 650 mm, amount of the thermal expansion of the substrate 30 becomes 650 mm×3 ppm=2.0 μm, if the linear expansion coefficient of the substrate is 3 ppm/° C., such that a positional error is caused in the irradiation position.

To correct this thermal expansion, there are methods as follows: making a correction to irradiation timing mainly based on the stage position measurement signal with a support of the measurement of the marks 35 on the substrate 30; and directly controlling the irradiation timing on the basis of the measurement signal of the marks 35 to achieve correction.

Figure 6:
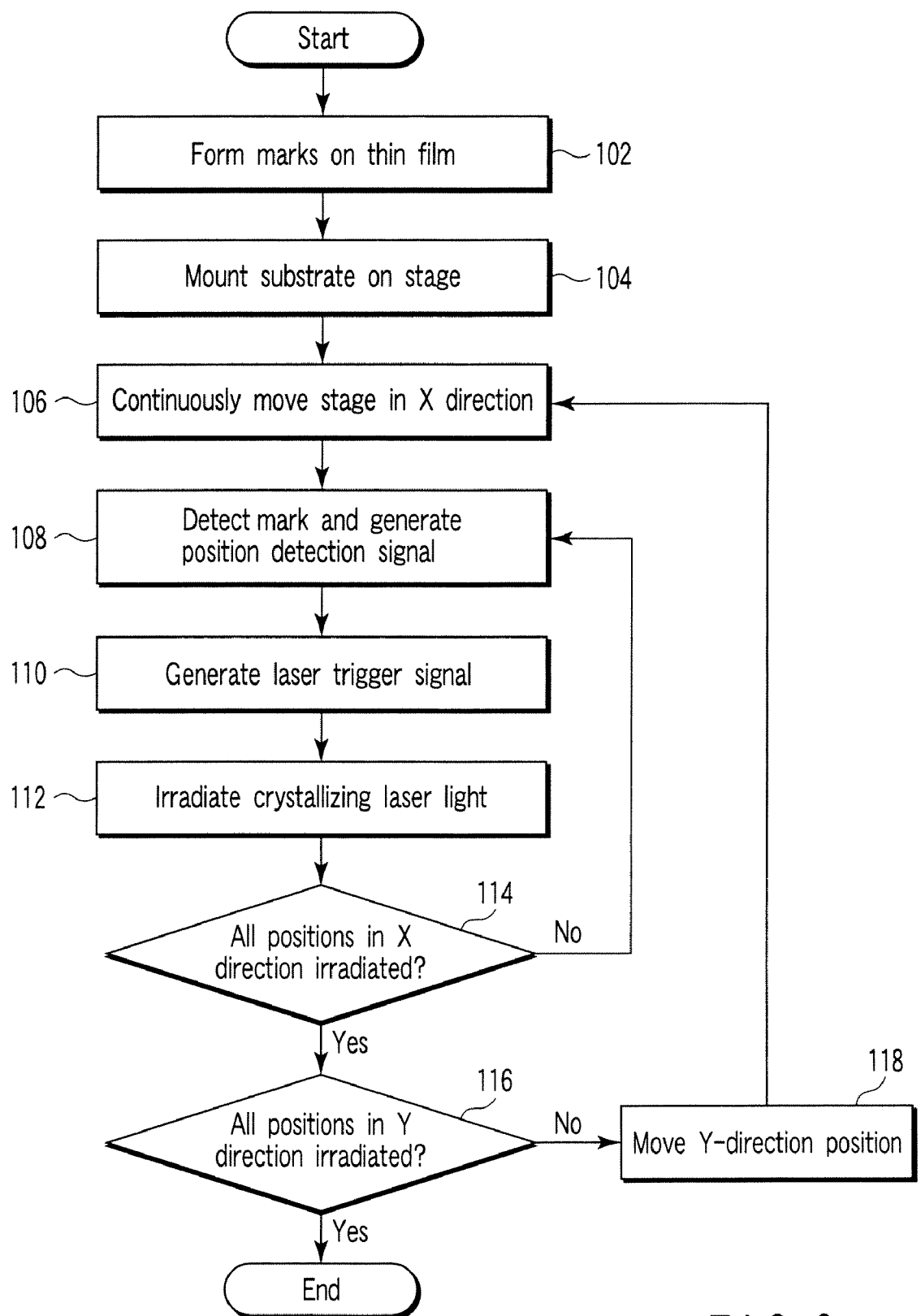
FIG. 6 is a flowchart for explaining one example of a crystallization process according to the first embodiment.

FIG. 6 is a flowchart shown to explain one example of the crystallization process for directly controlling the irradiation timing of the crystallizing laser light on the basis of the measurement signal of the marks 35 according to the present embodiment.

The crystallization process starts, in step 102, by forming the marks 35 in, for example, the non-single crystal semiconductor film 33 provided on the processing substrate 30. The marks 35 are line patterns formed, for example, by using a lithography process. As the marks 35, the patterns, for example, shown in FIGS. 3A and 3B can be used. Suppose that an irradiation area for one shot of the crystallizing laser light is, for example, 5 mm×10 mm and that the marks 35 are formed to correspond to each of the irradiation positions of the crystallizing laser lights, the marks 35 are periodically arranged with a pitch of 5 mm in the X direction and a pitch of 10 mm in the Y direction, as shown in FIG. 3A.

The processing substrate 30 is mounted on the substrate holding stage 40 (step 104), and the stage 40 is continuously moved in the X direction (step 106). The moving velocity of the substrate holding stage 40 in the X direction is, for example, 500 mm/sec, as described above.

The movement of the substrate holding stage 40 is monitored by the mark measuring system 60. At the same time, the position of the substrate holding stage 40 in the X direction can be measured by the X-direction position measuring unit 52.

Figure 7:
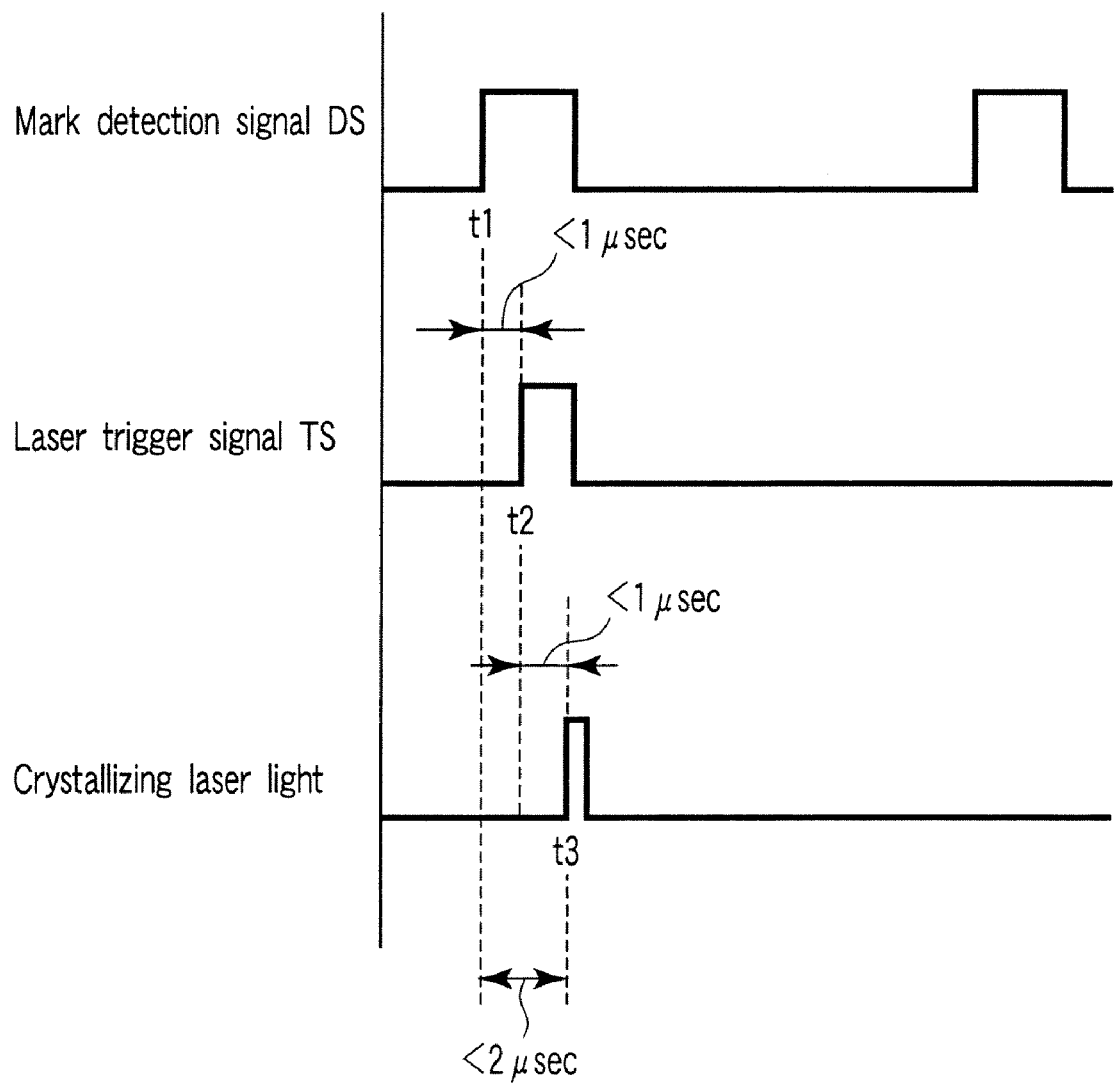
FIG. 7 is a diagram showing one example of a time line for explaining the relation of control signals from the detection of the mark to the irradiation of crystallizing laser light in the crystallization process shown in FIG. 6.

One example of a process from the detection of the predetermined mark 35 (step 108) to the irradiation of the crystallizing laser light (step 112) will be described referring to a time line shown in FIG. 7. The diagram is schematically shown to make it easier to understand.

At time t1, the mark measuring system 60 detects the predetermined mark on the non-single crystal semiconductor film 33, and then generates a mark detection signal DS (step 108). The mark detection signal DS is sent to the laser trigger signal generating system 70.

In response to the mark detection signal DS, the laser trigger signal generating system 70 generates a laser trigger signal TS at time t2 in accordance with predetermined conditions (step 110). Here, a case will be described where the trigger signal TS is generated just after the position detection signal DS is received. A delay time from the receipt of the mark detection signal DS to the generation of the laser trigger signal TS within the laser trigger signal generating system 70 is 1 μsec or less. The laser trigger signal TS is sent to the crystallizing laser light source 21.

On receipt of the laser trigger signal TS, the laser light source 21 generates crystallizing pulse laser light at time t3, and then irradiates the non-single crystal semiconductor film 33 on the processing substrate 30 (step 112). A delay time from the receipt of the laser trigger signal TS to the irradiation of the crystallizing laser light is 1 μsec or less.

In this example, a total delay time from the detection of the predetermined mark on the non-single crystal semiconductor film 33 by the mark measuring system 60 to the irradiation of the crystallizing laser light is t3−t1<2 μsec.

Then, proceed to step 114, it is decided whether all the predetermined positions in the X direction have been irradiated. If not, the process returns to step 108, and the next mark 35 is detected. If all the predetermined positions in the X direction have been irradiated, proceed to step 116. In step 116, it is decided whether all the predetermined positions in the Y direction have been irradiated. If not, the process proceeds to step 118, and the substrate holding stage 40 is moved to the next position in the Y direction, then returning to step 106. If all the predetermined positions in the Y direction have been irradiated, the process is completed.

In step 110 described above, it can be incorporated a predetermined delay time into steps from the receipt of the mark detection signal DS to the generation of the laser trigger signal TS by the laser trigger signal generating system 70. One example of which is a case where the width of the mark 35 is larger than the width mentioned above. In this case, in order to align a centerline of the crystallizing laser light irradiation area to the centerline of the predetermined crystallizing laser light irradiation area A, it is necessary to generate the trigger signal TS after receiving the mark detection signal DS and then moving a predetermined distance (on the basis of the measurement of the X-direction position measuring unit 52).

Figure 8:
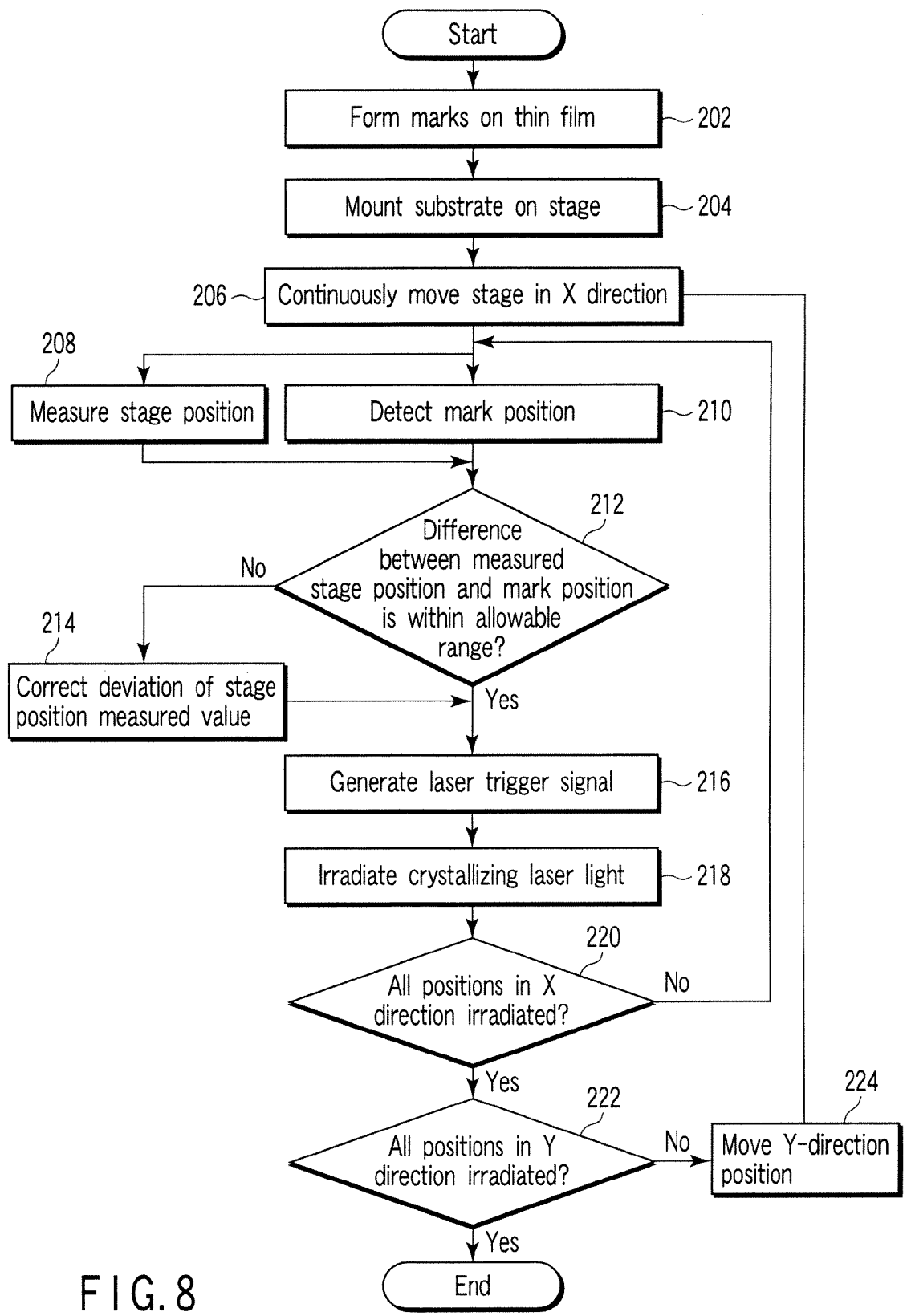
FIG. 8 is a flowchart for explaining another example of the crystallization process according to the first embodiment.

FIG. 8 is a flowchart shown to explain another example of the crystallization process according to the present embodiment. In this example, there is shown a method in which the deformation such as expansion of the processing substrate 30 is corrected mainly based on the measurement of the stage position supported by the measurement of the marks 35 on the processing substrate 30 to irradiate the crystallizing laser light correctly.

In the crystallization process in this example, step 202 to step 206 are the same as step 102 to step 106 in the above example in FIG. 6. That is, the processing substrate 30 in which the marks 35 are formed on the non-single crystal semiconductor film 33 is mounted on the substrate holding stage 40, and the substrate holding stage 40 is continuously moved in the X direction.

The movement of the substrate holding stage 40 is continuously measured by the stage position measuring system 50 (step 208). Independently of this measurement of the stage position, the mark measuring system 60 detects a position of a mark 35 provided at a predetermined position in the processing substrate 30 temporarily fixed to the substrate holding stage 40, and generates a mark detection signal DS (step 210). If the processing substrate 30 expands or warps (the deformation of the processing substrate 30) due to heat during the crystallization process, the measured position of the substrate holding stage 40 corresponding to the detected mark 35 can be displaced from the predetermined crystallization laser light irradiation position.

Thus, in step 212, the measured mark detection signal DS corresponding to the position of the mark 35 detected is compared with a position signal of the substrate holding stage 40 measured by the stage position measuring system 50, thereby deciding whether the difference therebetween is within a predetermined allowable range. If the difference is within the allowable range, the mark detection signal DS is sent to the laser trigger signal generating system 70, and proceed to step 216. If the difference is out of the allowable range, the stage position measuring system 50, in step 214, outputs a control signal for correcting the position of the substrate holding stage 40 to the stage driving unit 45 so that the displacement of the processing substrate 30 due to its own deformation is corrected within the predetermined allowable range. The stage driving unit 45 corrects and controls the position of the substrate holding stage 40 in accordance with the control signal for correcting the deformed amount of the processing substrate 30. After correcting the position of the substrate holding stage 40, the mark measuring system 60 sends the mark detection signal DS to the laser trigger signal generating system 70, thus proceeding to step 216.

From step 216 for the generation of the laser trigger signal TS to step 224 are the same as step 110 to step 118 in the example in FIG. 6, so that they are not described.

Therefore, the crystallization process has a function capable of accurately correcting the irradiation position of the crystallizing laser light on the basis of the measured results of both the stage position measuring system 50 and the mark measuring system 60, if a microscopic deformation is caused in the processing substrate 30 during the crystallization process and is larger than the predetermined allowable range. In other words, the crystallization process has a positional alignment function.

According to the present embodiment, time required for irradiating the crystallizing laser light with size of, for example, 10 mm×5 mm, on the whole area of a large-area substrate of, for example, 550 mm×550 mm is, for example, (650 mm/500 mm/sec)×(550 mm/10 mm)=71.5 sec.

In practice, the laser crystallization apparatus 100 repeats the X-direction scan 55 times in total by reversing X scanning direction every time when one X-direction scan on the processing substrate 30 mounted on the substrate holding stage 40 is finished and the stage 40 is moved to the next position in the Y direction. Therefore, the crystallization process requires time for the movement in the Y direction and deceleration and acceleration times for reversing the movement of the substrate holding stage 40 in the X direction. Even if these are taken into consideration, the throughput of the crystallization process enables the processing of about 20 to 30 pieces per hour, thereby achieving a high throughput according to the embodiment.

In the present embodiment, the highly accurate positional alignment in the X direction has been described, it can be simultaneously employed position control in the Y direction and/or the Z direction vertical to the surface of the non-single crystal semiconductor film 33 by using the Y-direction position measuring unit 53 and/or the Z-direction position measuring unit 54 in the position measuring system 50.

Even in the case of a highly accurate stage using an air bearing and linear motor driving, its straightness is about 10 μm in the Y and Z directions at best if a stroke is, for example, as long as 1 m. Therefore, it is preferable to make positional corrections in the Y direction and/or the Z direction while moving the substrate holding stage 40 in the X direction because it is required that the crystallizing laser light is being irradiated with a positional accuracy of 1 μm or less in a PMELA apparatus. These positional corrections can be made using the stage position measuring system 50.

This makes it possible to provide a laser crystallization apparatus and a crystallization method with a high throughput capable of the highly accurate positioning and capable of irradiating the crystallizing laser light having a predetermined light intensity distribution to the substrate positioned very quickly and with a high positional accuracy to melt and crystallize the semiconductor film in order to form the semiconductor film having a large crystal grain size.

Second Embodiment

In a second embodiment of the present invention, marks 35Y in a Y direction are formed in addition to marks 35X in an X direction, so that crystallizing laser light is irradiated while positioning is highly accurately carried out in both X and Y directions, thereby achieving crystallization. The same numerals are assigned to the same parts as those in FIGS. 1 to 8, and these parts are not described in detail.

Figure 9A:
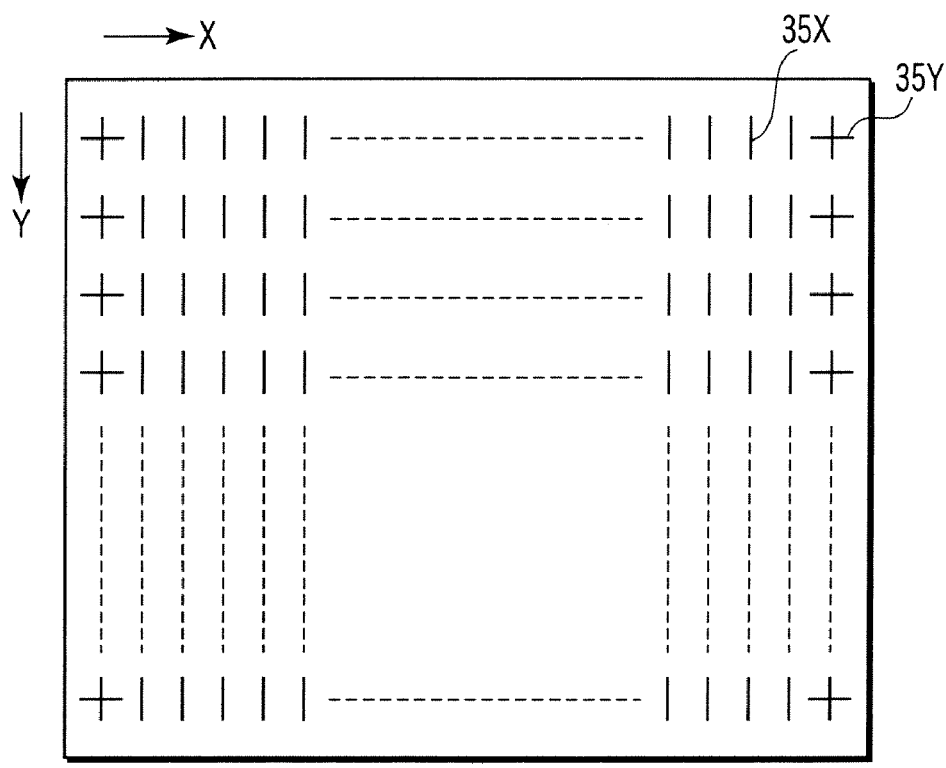
FIGS. 9A and 9B are plan views showing two examples of entire mark arrangement to explain a second embodiment of the present invention.
Figure 10:
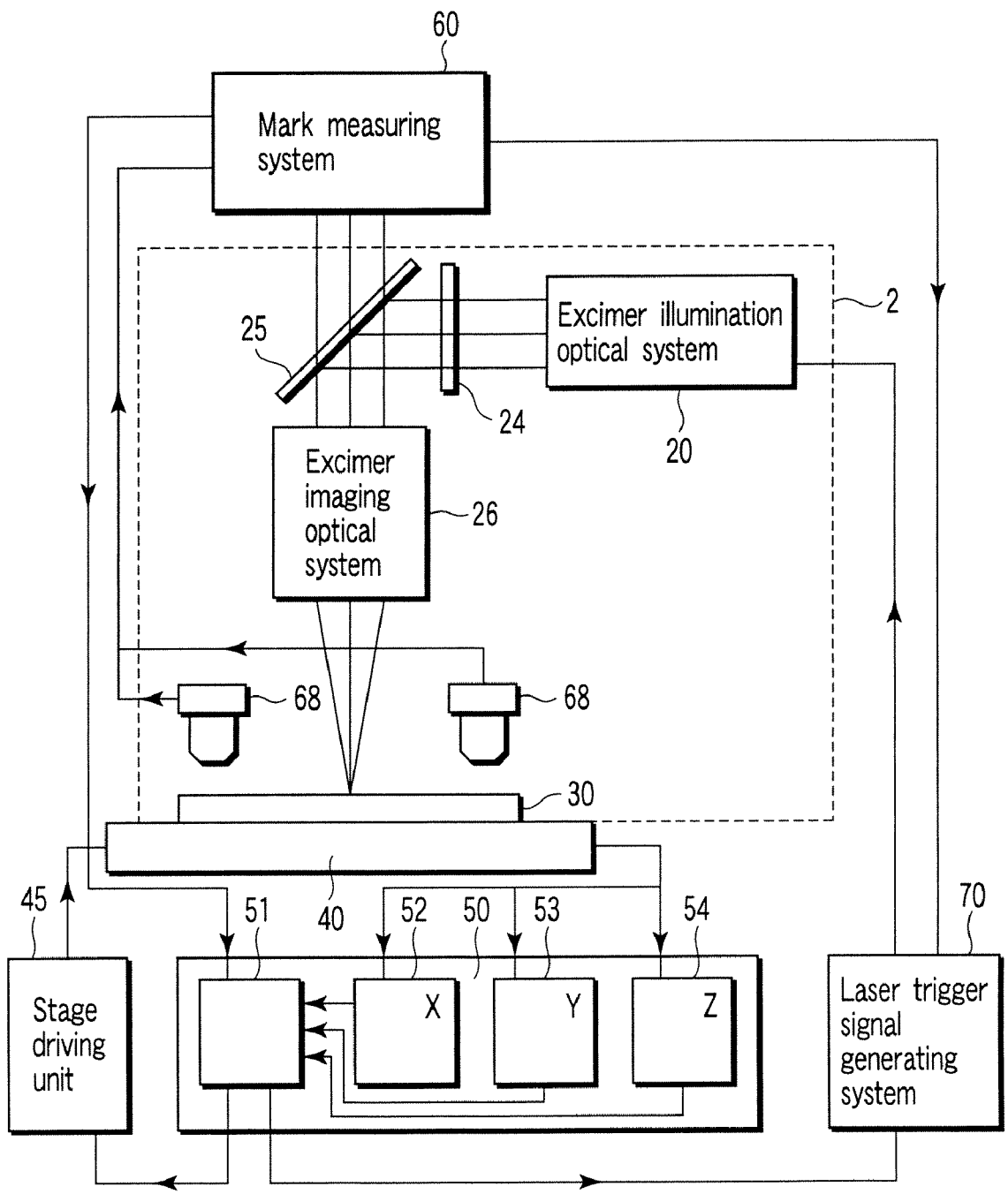
FIG. 10 is a system configuration diagram of one example of a laser crystallization apparatus shown to explain the second embodiment.

An example of the arrangement of the alignment marks 35 on a processing substrate 30 used in the present embodiment is shown in FIG. 9A. The marks 35Y in the Y direction are formed at both ends of an X scanning direction of a non-single crystal semiconductor film 33 provided in the processing substrate 30 (e.g., along the short sides thereof) at positions corresponding to positions to be scanned in the X direction. In FIG. 9A, the marks 35Y are indicated by + marks. X-direction marks 35X are formed in between, and indicated by vertical lines in FIG. 9A. Since positioning accuracy in the Y direction is not required as high as that in the X direction in the alignment, it can be achieved enough effects by providing the Y-direction marks 35Y, for example, only at both ends of the respective rows in the substrate to which the crystallizing laser light is scanned. A mark measuring system 60 or 60' shown in FIG. 1 or 4, for example, can be used to measure the Y-direction marks 35Y. Moreover, it can be achieved by using one or a plurality of Y-direction mark detecting cameras 68 arranged as shown in FIG. 10 in addition to the mark measuring system 60. Signals from the Y-direction mark detecting cameras 68 are sent to the mark measuring system 60 to generate a Y-direction measurement signal. The Y-direction measured signal is sent from the mark measuring system 60 to a stage position measuring system 50, and the position of a substrate holding stage 40 in the Y direction is corrected. Therefore, the position in the Y direction is aligned using the Y-direction marks 35Y at the beginning of each movement in the X direction at first, and then a crystallization process is executed while the position of the substrate in the Y direction is being aligned by a Y-direction position measuring unit 53. It can be performed the alignment of the substrate in the Y direction every few X-scans instead of every scan in the X direction as described above.

Figure 11:
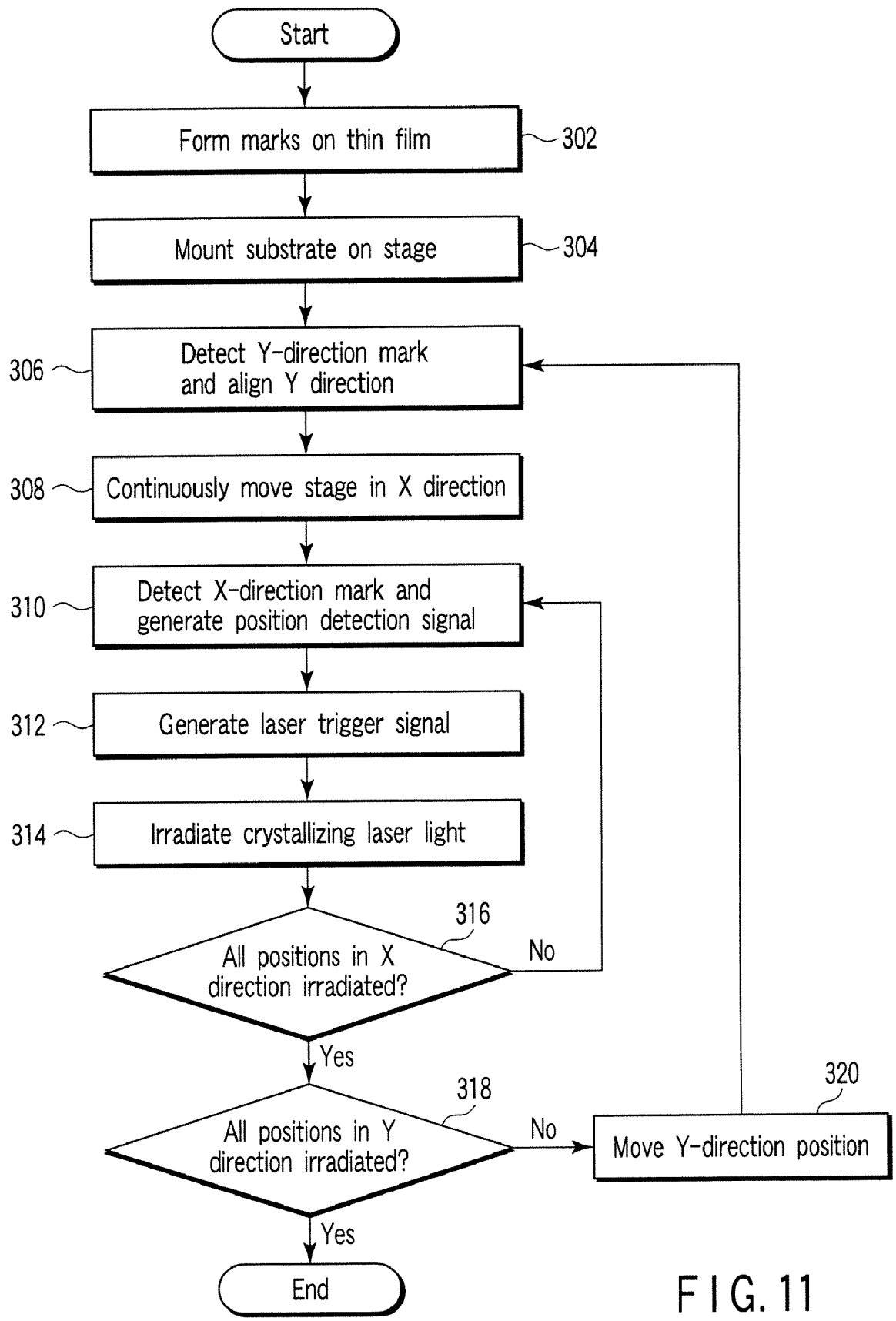
FIG. 11 is a flowchart shown to explain one example of a crystallization process according to the second embodiment.

One example of another crystallization process in the present embodiment will be described in accordance with a flowchart shown in FIG. 11. The same numerals are assigned to the same parts as those in FIGS. 1 to 10, and these parts are not described in detail.

The crystallization process starts by forming the marks 35 in the non-single crystal semiconductor film 33 provided on the processing substrate 30 in step 302. The marks 35 are optically detectable patterns formed by, for example, using a lithography process. As has been shown in FIG. 9A, the marks 35Y in the Y direction are provided at both ends of the X scanning direction of a non-single crystal semiconductor film 33 at positions corresponding to X-direction scanning positions of the processing substrate 30, and the marks 35X in the X direction are provided between the marks 35Y.

The processing substrate 30 in which the marks 35 are formed is mounted on the substrate holding stage 40 (step 304). The position of the substrate holding stage 40 is monitored by the mark measuring system 60 and the position measuring system 50. In step 306, the mark measuring system 60 detects the Y-direction mark 35Y provided at a starting end of the X scanning direction of the processing substrate 30 to accurately align the position of the processing substrate 30 in the Y direction.

After the alignment in the Y direction, the substrate holding stage 40 starts a continuous movement in the X direction (step 308). The moving velocity of the substrate holding stage 40 in the X direction is, for example, 500 mm/sec, as described above.

Along with the movement of the processing substrate 30 in the X direction, the mark measuring system 60 detects the X-direction mark 35X in step 310. Then, the mark measuring system 60 generates a mark detection signal DS and sends it to a laser trigger signal generating system 70.

In response to receipt of the mark detection signal DS, in step 312, the laser trigger signal generating system 70 generates a laser trigger signal TS in accordance with predetermined conditions, and sends the trigger signal TS to a crystallizing laser light source 21. The predetermined conditions includes, for example, generating the laser trigger signal TS just after the mark detection signal DS is received, or generating the laser trigger signal TS after a predetermined delay time.

In step 314, on receipt of the laser trigger signal TS, the laser light source 21 generates crystallizing pulse laser light, and the crystallizing laser light irradiates the non-single crystal semiconductor film 33 on the processing substrate 30.

Then, proceeding to step 316, it is decided whether all the predetermined positions in the X direction have been irradiated. If not, the process returns to step 310, and the next X-direction mark 35X is detected. If all the predetermined positions in the X direction have been irradiated, the process proceeds to step 318. In step 318, it is decided whether all the predetermined positions in the Y direction have been irradiated. If not, the process proceeds to step 320, and the substrate holding stage 40 is moved to the next position in the Y direction, then returning to step 306. If all the predetermined positions in the Y direction have been irradiated, the process is completed.

Thus, both the marks 35X and 35Y for the X and Y directions are used for highly accurate alignment not only in the X direction but also in the Y direction, such that the crystallization can be achieved.

Figure 9B:
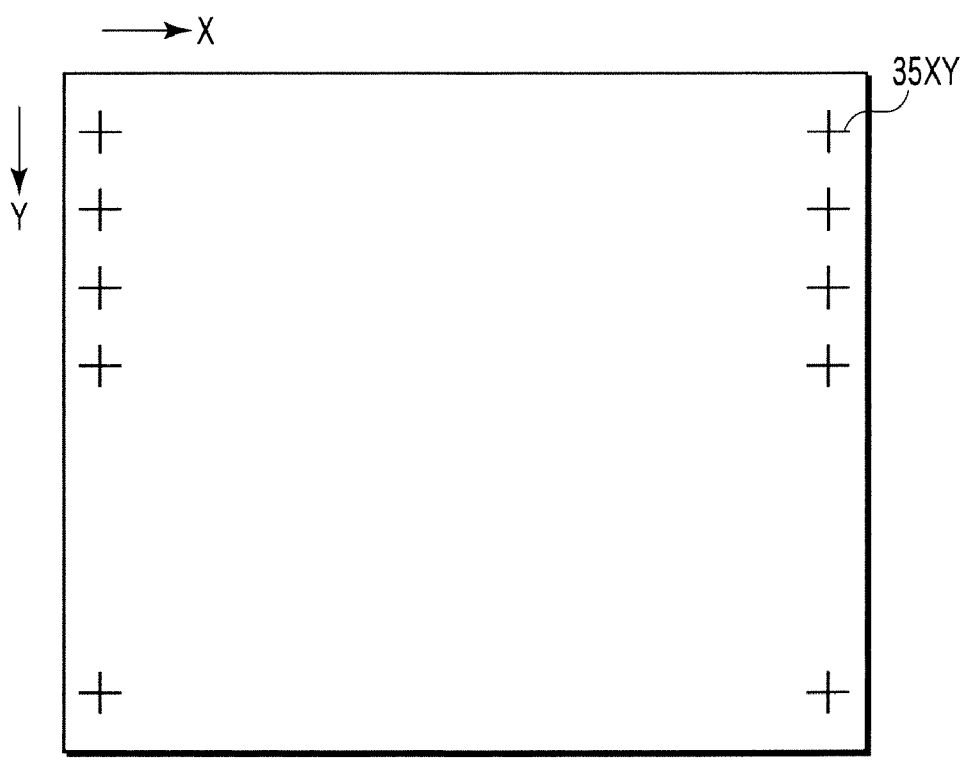

The marks 35 are not limited to those described above, and various marks may be conceivable. For example, as shown in FIG. 9B, marks 35XY for simultaneous alignment in the X and Y directions are only provided at both ends of the non-single crystal semiconductor film 33 at positions corresponding to the X-direction scanning positions of the processing substrate 30, and a crystallizing laser light irradiation position in the X direction between the marks at both ends can be decided on the basis of a measured result of an X-direction position measuring unit 52.

This makes it possible to provide a laser crystallization apparatus and a crystallization method with a high throughput capable of forming a high-quality semiconductor film having a large crystal grain size in a highly accurately positioned area by melting and crystallizing the semiconductor film while continuously moving the processing substrate.

The above description of the embodiments disclosed herein has been given such that those skilled in the art can make and use the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser crystallization apparatus for irradiating a thin film provided on a substrate, the substrate having marks, the apparatus comprising:
    a laser light source which generates laser light;
    a phase shifter which modulates the laser light to give a predetermined light intensity distribution thereto, the laser light modulated by the phase shifter is irradiated to the thin film provided on the substrate to melt and crystallize the thin film;
    a substrate holding stage which mounts the substrate and which moves in a predetermined direction;
    mark measuring means measuring a time at which one of the marks on the substrate passes a predetermined position during the movement of the substrate holding stage; and
    signal generating means generating a trigger signal with a delay from said time measured by the mark measuring means, which indicates a start of the irradiation of the laser light onto a defined location on the substrate.

2. The laser crystallization apparatus according to claim 1, further comprising position measuring means measuring the position of the substrate holding stage.

3. The laser crystallization apparatus according to claim 2, wherein the signal generating means generates the trigger signal which indicates the irradiation of the laser light on the basis of the measurement of the mark by the mark measuring means and on the basis of the measurement of the position of the substrate holding stage by the position measuring means.

4. The laser crystallization apparatus according to claim 1, wherein the plurality of marks are arranged on the thin film.

5. The laser crystallization apparatus according to claim 1, wherein the marks are detectable by optical means.

6. The laser crystallization apparatus according to claim 5, wherein the marks are formed by using a lithography process.

7. The laser crystallization apparatus according to claim 1, wherein a delay time from at least one of the measurement of one of the marks corresponding to an irradiation position of the laser light and the measurement of the position of the substrate holding stage to the generation of the trigger signal is one microsecond or less.

8. The laser crystallization apparatus according to claim 1, wherein the thin film is an amorphous silicon film.

9. The laser crystallization apparatus according to claim 1, wherein the laser light is excimer laser light.

10. The laser crystallization apparatus according to claim 1, wherein the marks are disposed in periodic patterns formed linearly in the predetermined direction.

11. A laser crystallization apparatus for irradiating a thin film provided on a substrate, the substrate having first and second marks which indicate positions in a first and a second direction, respectively, the first and second directions being perpendicular to each other, the apparatus comprising:
    a laser light source which generates laser light;
    a phase shifter which modulates the laser light to give a predetermined light intensity distribution thereto, the laser light modulated by the phase shifter being irradiated to the thin film provided on the substrate to melt and crystallize the thin film;
    a substrate holding stage which mounts the substrate and can move the substrate in the first direction and in the second direction;
    first mark measuring means measuring a time at which one of the first marks passes a predetermined position in the first direction during a movement of the substrate in the first direction;
    second mark measuring means measuring one of the second marks to correct a position of the substrate in the second direction before the movement of the substrate in the first direction; and
    signal generating means generating a trigger signal which indicates the irradiation of the laser light on the basis of the time measured by the first mark measuring means.

12. The laser crystallization apparatus according to claim 11, further comprising position measuring means measuring the position of the substrate holding stage.

13. The laser crystallization apparatus according to claim 12, wherein the signal generating means generates the trigger signal which indicates the irradiation of the laser light on the basis of the measurement of the mark by the first mark measuring means and on the basis of the measurement of the position of the substrate holding stage by the position measuring means.

14. The laser crystallization apparatus according to claim 11, wherein a plurality of first marks are arranged on the thin film.

15. The laser crystallization apparatus according to claim 11, wherein the first and second marks are detectable by optical means.

16. The laser crystallization apparatus according to claim 15, wherein the first and second marks are formed by using a lithography process.

17. The laser crystallization apparatus according to claim 11, wherein a delay time from at least one of the measurement of the first mark corresponding to an irradiation position of the laser light and the measurement of the position of the substrate holding stage to the generation of the trigger signal is one microsecond or less.

18. The laser crystallization apparatus according to claim 11, wherein the thin film is an amorphous silicon film.

19. The laser crystallization apparatus according to claim 11, wherein the laser light is excimer laser light.

20. The laser crystallization apparatus according to claim 11, wherein the measurement by the second mark measuring means is executed prior to the measurement by the first mark measuring means.

21. A laser crystallization method comprising:
   forming, on a substrate, first marks indicating positions of the substrate in a predetermined first direction and second marks indicating positions of the substrate in a second direction perpendicular to the first direction;
   generating laser light;
   modulating the laser light to a predetermined light intensity distribution;
   mounting the substrate on a substrate holding stage;
   measuring one of the second marks to correct the position of the substrate in the second direction before the movement of the substrate in the first direction;
   continuously moving the substrate holding stage mounting the substrate in the first direction;
   measuring a time at which one of the first marks provided on the moving substrate passes a predetermined position;
   generating a trigger signal which indicates the irradiation of the modulated laser light on the basis of the time measured by the first mark measurement; and
   irradiating the modulated laser light to the substrate in response to the trigger signal to melt and crystallize a thin film disposed on the substrate.

22. A laser crystallization method comprising:
   forming marks on a substrate;
   generating laser light;
   modulating the laser light to a predetermined light intensity distribution;
   continuously moving a substrate holding stage mounting the substrate in a predetermined direction;
   measuring a time at which one of the marks provided on the moving substrate passes a predetermined position;
   generating a trigger signal with a delay from the measured time which indicates a start of the irradiation of the modulated laser light onto a defined location of the substrate; and
   irradiating the modulated laser light to a thin film disposed on the substrate in response to the trigger signal to melt and crystallize an irradiated area.

23. The laser crystallization method according to claim 22, further comprising the step of:
   measuring a position of the substrate holding stage during said step of continuously moving,
   wherein said step of generating the trigger signal generates the trigger signal based on a result of said step of measuring the time and based on a result of said step of measuring the position.

* * * * *